(12) United States Patent
Fujikura

(10) Patent No.: US 9,779,934 B2
(45) Date of Patent: Oct. 3, 2017

(54) NITRIDE SEMICONDUCTOR FREE-STANDING SUBSTRATE, METHOD OF MANUFACTURING THE SAME AND NITRIDE SEMICONDUCTOR DEVICE

(75) Inventor: Hajime Fujikura, Mito (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 1966 days.

(21) Appl. No.: 12/591,423

(22) Filed: Nov. 19, 2009

(65) Prior Publication Data

US 2011/0108944 A1    May 12, 2011

(30) Foreign Application Priority Data

Nov. 8, 2009    (JP) .................................. 2009-186612

(51) Int. Cl.
| | |
|---|---|
| H01L 29/12 | (2006.01) |
| H01L 21/02 | (2006.01) |
| C30B 29/40 | (2006.01) |
| C30B 33/02 | (2006.01) |
| H01L 33/00 | (2010.01) |
| H01S 5/323 | (2006.01) |

(52) U.S. Cl.
CPC ........ *H01L 21/0242* (2013.01); *C30B 29/403* (2013.01); *C30B 33/02* (2013.01); *H01L 21/0254* (2013.01); *H01L 21/02458* (2013.01); *H01L 21/02642* (2013.01); *H01L 21/02647* (2013.01); *H01L 21/02664* (2013.01); *H01L 33/0075* (2013.01); *H01S 5/32341* (2013.01); *H01S 2304/12* (2013.01)

(58) Field of Classification Search
USPC .. 257/507, E29.068, E29.024, 615, E29.089
See application file for complete search history.

(56) References Cited

U.S. PATENT DOCUMENTS

| | | |
|---|---|---|
| 2006/0027896 A1 | 2/2006 | Fujiwara et al. |
| 2007/0290228 A1* | 12/2007 | Yoshida ........................ 257/190 |

FOREIGN PATENT DOCUMENTS

JP    2006-44982    2/2006

OTHER PUBLICATIONS

Yuichi Oshima, et al., "Preparation of Freestanding GaN Wafers by Hydride Vapor Phase Epitaxy with Void-Assisted Separation," Japanese Journal of Applied Physics, vol. 42 (2003), pp. L1-L3.
Kensaku Motoki, et al., "Proceedings of the 4th International Workshop on Bulk Nitride Semiconductors IV," Journal of Crystal Growth, vol. 305 (2007), pp. 377-383.
R. Nowak, et al., "Elastic and plastic properties of GaN determined by nano-indentation of bulk crystal," Applied Physics Letters, vol. 75 (1999) pp. 2070-2072.
K Saarinen, et al., "Observation of Native Ga Vacancies in GaN Positron Annihilation," Physical Review Letters, vol. 79 (1997) pp. 3030-3033.

* cited by examiner

*Primary Examiner* — Tran Tran
(74) *Attorney, Agent, or Firm* — McGinn IP Law Group, PLLC

(57) ABSTRACT

A nitride semiconductor free-standing substrate includes a diameter of not less than 40 mm, a thickness of not less than 100 μm, a dislocation density of not more than $5\times10^6/cm^2$, an impurity concentration of not more than $4\times10^{19}/cm^3$, and a nanoindentation hardness of not less than 19.0 GPa at a maximum load in a range of not less than 1 mN and not more than 50 mN.

6 Claims, 12 Drawing Sheets

(a)

(b)

(c)

NITRIDE SEMICONDUCTOR FREE-STANDING SUBSTRATE, METHOD OF MANUFACTURING THE SAME AND NITRIDE SEMICONDUCTOR DEVICE

The present application is based on Japanese Patent Application No. 2009-186612 filed on Aug. 11, 2009, the entire contents of which are incorporated herein by reference.

BACKGROUND OF THE INVENTION

1. Field of the Invention

The invention relates to a nitride semiconductor free-standing substrate, a method of manufacturing the same and a nitride semiconductor device, in more particular, relates to a nitride semiconductor free-standing substrate used for electronic devices such as a light-emitting element which emits blue light, green light or ultraviolet light, a method of manufacturing the same and a nitride semiconductor device.

2. Description of the Related Art

In recent years, a free-standing substrate formed of GaN single crystal which is a nitride semiconductor single crystal with low defect density has been provided by various manufacturing methods, and a semiconductor laser using a nitride semiconductor is in practical use. As a method of manufacturing a free-standing substrate formed of GaN single crystal, for example, a method in which GaN is grown thick on a seed substrate by Hydride Vapor Phase Epitaxy (HVPE) method and the seed substrate is removed during or after the growth, Na flux method in which a Ga metal is mixed into molten Na and pressure is subsequently applied to the entirety thereof by nitrogen for precipitating GaN on a seed crystal, high-pressure synthesis method for synthesizing GaN directly from Ga and nitrogen under the high temperature and high pressure, ammonothermal synthesis in which Ga or GaN is dissolved in ammonia for precipitating GaN on a seed crystal under the lower temperature and lower pressure than the high-pressure synthesis method, and sublimation method for synthesizing GaN from Ga vapor and ammonia, etc., are known.

Among these various manufacturing methods, certain manufacturing methods using the HVPE method are currently most successful, and GaN free-standing substrates with large area (with a diameter of 2 inches) manufactured by these methods have been already commercially available. For example, a method in which Ti is deposited on a surface of a GaN thin film on a sapphire substrate and heat treatment is applied for forming a void on the surface of the GaN thin film, GaN is grown thick thereon by the HVPE method and the sapphire substrate is subsequently removed from the void portion (Void-Assisted Separation: VAS method, e.g., see a non-patent literary document of Yuichi Oshima et. Al. Japanese Journal of Applied Physics, Vol. 42 (2003) pp. L1-L3) is known. In addition, a method in which a surface of a GaAs substrate is partially covered by an insulator mask, GaN is grown thick on the insulator mask using the HVPE method and the GaAs substrate is subsequently removed (DEEP method, e.g., see a non-patent literary document of Kensaku Motoki et. al., Journal of Crystal Growth Vol. 305 (2007) pp. 377-383) is known.

In addition, it is reported that, when hardness of high-pressure synthesized GaN microcrystal (3 mm×2 mm×0.3 mm) was measured by nanoindentation method, the hardness of 20 GPa was obtained (e.g., see a non-patent literary document of R. Nowak et. al., Applied Physics Letters Vol. 75 (1999) pp. 2070-2072). In addition, it is reported that GaN single crystal is high-pressure synthesized and a carried concentration in GaN is adjusted to $5 \times 10^{19}/cm^3$ (e.g., see a non-patent literary document of K. Saarinen et. al., Physical Review Letters Vol. 79 (1997) pp. 3030-3033).

In addition, a nitride semiconductor single crystal substrate, which has a composition of $Al_xGa_{1-x}N$ ($0 \leq x \leq 1$), a fracture toughness value of (1.2-1.7x) MPa·m$^{1/2}$ or more and a dimension of 20 cm$^2$ or more, is known (e.g., see JP-A 2006-44982). In the nitride semiconductor single crystal substrate described in JP-A 2006-44982, since fracture toughness has been improved, it is possible to suppress destruction of the nitride semiconductor single crystal substrate and to improve productivity in a manufacturing process of a semiconductor electronic device using the nitride semiconductor single crystal substrate.

SUMMARY OF THE INVENTION

However, a GaN substrate is still expensive even if conventionally manufactured by the HVPE method, etc., and when comparing with, e.g., a GaAs substrate or an InP substrate, etc., cost difference per unit area is ten times or more. One of the reasons is that the processing of the GaN substrate is difficult. The GaN substrate is manufactured by processing GaN single crystal grown by the HVPE method, etc., into a wafer (free-standing substrate) having a diameter of 2 or 3 inches, etc., by slicing, grinding or polishing, etc. The GaN single crystal is more likely to be cracked or broken during this processing, and a production yield of the GaN free-standing substrate is very low. This causes the increase in the production cost per GaN free-standing substrate.

Here, a process yield tends to decrease as a size of the GaN single crystal as a raw material of the GaN free-standing substrate is larger or thicker. For example, when a 80 μm thick GaN free-standing substrate of 30 mmφ is made from 90 μm thick GaN single crystal having a diameter of 35 mmφ, it is possible to achieve a high process yield of 90% or more. However, when the GaN single crystal has a size of 40 mmφ or more and a thickness of 100 μm or more, the process yield rapidly decreases. In detail, the process yield is about 20% when a 400 μm thick GaN free-standing substrate having a diameter of 50.8 mmφ is made from 1 mm thick GaN single crystal having a diameter of 52 mmφ by grinding or polishing. In addition, the process yield is about 5% when a 500 μm thick GaN free-standing substrate having a diameter of 76.2 mmφ is made from 5 mm thick GaN single crystal having a diameter of 80 mmφ through processes of slicing, grinding or polishing. It is considered that, since a residual stress stored inside the crystal during the growth of the single crystal increases when the GaN single crystal becomes thick and large, a risk of breakage at the time of processing increases.

In practical use, the number of devices manufactured per substrate increases as the dimension of the GaN free-standing substrate is large, and it is thereby possible to reduce the cost per device. A substrate having a diameter of 2 inches (50.8 mm) or more is desired in the industrial use. In addition, considering the handling of the substrate during the device production, the GaN free-standing substrate preferably has a thickness of 100 μm or more. When the GaN free-standing substrate is thinner than 100 μm, the risk that the substrate is broken during the device production becomes high. In other words, in the prior art, since the GaN single crystal as a raw material of the GaN free-standing substrate is required to be formed large and thick in order to manufacture a thick (≥100 μm) GaN free-standing substrate with a large dimension (≥40 mmφ) which is suitable for the industrial use, the process yield decreases and the cost of the GaN free-standing substrate becomes high.

During the production of the GaN free-standing substrate, in addition to the residual stress originally existing in the GaN single crystal, a stress based on a force applied by a processing jig in contact with the GaN single crystal is generated therein in the manufacturing processes thereof. It is considered that, when the hardness of the GaN single crystal is small with respect to the stress which is the residual stress combined with the stress based on the processing jig, defects such as breakages and cracks are generated in the GaN single crystal. It should be noted that, in the present specification, "hardness" is small means that the GaN single crystal is likely to be plastically deformed. When an excessive stress is generated in the GaN single crystal, a sliding movement occurs in the dislocation which already exists in the GaN single crystal, new dislocation is generated/multiplied or motion of the generated/multiplied dislocation occurs, and the GaN single crystal is thereby plastically deformed. When the plastic deformation further proceeds, microscopic flaws are generated in the GaN single crystal. Then, defects such as cracks and breakages are generated in the GaN single crystal from the generated microscopic flaws.

Here, Vickers test in which an indenter with a μm-size tip diameter is pushed into a material and hardness thereof is estimated from the load at that time and a size of the indentation, and nanoindentation method in which a tip diameter of an indenter is several tens of nm in size, etc., are known as a method of examining hardness of a material (i.e., an anti-plastic deformation property). Since the tip diameter of the indenter is large in the Vickers test, there is a disadvantage in that, when nonuniformity or imperfection, etc., in a scale of μm level exists in the material to be a test subject, the results are different depending on degree of nonuniformity/imperfection at the measurement point, which makes difficult to obtain a stable measurement result. For the purpose of removing influence of the nonuniformity and the imperfection and measuring the inherent hardness of the material, the nanoindentation method using an indenter with a small tip diameter is suitable.

As a method of deriving the hardness of the material by the nanoindentation method, the method developed by Olivier (W. C. Olivier and G. M. Pharr, J. Mater. Res. Vol. 7, 1567 (1992)) is known in which an entry amount of the indenter is measured at an accuracy of nanometer while pushing a diamond indenter into a sample at a continuous load and an elastoplastic property of the sample is evaluated from a relation between the obtained load and entry amount.

The present inventors made a GaN free-standing substrate used for manufacturing electron devices by using a conventional VAS method, and measured hardness of the manufactured GaN free-standing substrate at the maximum load within a range from 1 mN to 50 mN by using the above-mentioned nanoindentation method. As s result of examining the hardness of the GaN free-standing substrate (hereinafter, the hardness measured using the nanoindentation method is simply referred to as "the hardness"), the hardness thereof was smaller than 19.0 GPa.

Here, a method of enhancing hardness of a material formed of a nitride semiconductor includes, e.g., a method in which dislocation density is increased, or a method in which a high concentration impurity is added. When the dislocation density is increased, each dislocation forms a network and impedes each other's motion, deformation of a material associated with the motion of dislocation (the plastic deformation) becomes less likely to be generated and the hardness of the material increases. Meanwhile, when the high concentration impurity is added, since the presence of the impurity impedes the motion of dislocation, it is possible to increase the hardness of the material also in this case.

According to the examination of the inventors, it was revealed that, at the time of manufacturing the GaN free-standing substrate, when the dislocation density thereof is increased larger than $5\times10^6/cm^2$, or, more than $4\times10^{19}/cm^3$ of impurity such as Si, C, Mg, Zn, Sn, Fe, Sn, Te, Ge or O is added to crystal, the hardness of the GaN crystal can be 19.0 GPa or more, and 20.0 GPa or more in the best case. When the hardness of the GaN crystal was 19.0 GPa, the process yield was improved to 30% from the above-mentioned 10% in case that a 500 μm thick GaN wafer having a diameter of 76.2 mmφ is made from 5 mm thick GaN single crystal having a diameter of 80 mφ. In addition, when the hardness of the GaN crystal was 20.0 GPa, the process yield was improved to 50%. However, when GaN crystal is applied to a device such as a semiconductor laser, the lifetime of the device is short and is not practical unless the dislocation density is $5\times10^6/cm^2$ or less, on the other hand, when the impurity concentration in the GaN substrate is too high, device properties are adversely affected by impurity diffusion into the device formed on the GaN substrate, therefore, the impurity concentration in the GaN free-standing substrate is desirably $4\times10^{19}/cm^3$ or less. In other words, none of the method of increasing the dislocation density or the method of adding the large amount of impurity is acceptable in practical use.

Here, the non-patent literary document of R. Nowak et. al., Applied Physics Letters Vol. 75 (1999) pp. 2070-2072 reported that, when hardness of high-pressure synthesized GaN microcrystal was measured by the nanoindentation method, hardness of 20 GPa was obtained. According to the earlier reports, GaN crystal obtained by the high-pressure synthesis method is normally stained black, thus, it is considered that a high consecration impurity is contained. In fact, when referring to another report from the same group (the non-patent literary document of K. Saarinen et. al., Physical Review Letters Vol. 79 (1997) pp. 3030-3033), a value of $5\times10^{19}/cm^3$ is reported as a carrier concentration in high-pressure synthesized GaN, and GaN crystal has a carrier concentration equivalent to or more than $5\times10^{19}/cm^3$ also in the non-patent literary document of R. Nowak et. al., Applied Physics Latters Vol. 75 (1999) pp. 2070-2072, thus, relatively large hardness being 20 GPa may be mentioned.

In a large-size nitride semiconductor single crystal which is a base of a practical-size nitride semiconductor free-standing substrate (diameter≥40 mm and thickness≥100 μm), any examples, which realize nanoindentation hardness of 19 GPa or more essential for achieving the high process yield while controlling the impurity concentration to $4\times10^{19}/cm^3$ or less, have not been reported including the cases using the above-mentioned HVPE method and the high-pressure synthesis method.

As another method of improving a process yield of a nitride semiconductor free-standing substrate, JP-A 2006-44982 describes a method in which fracture toughness of AlGaN single crystal is improved. The fracture toughness is a numerical value which represents anti-expansion properties of flaw when a flaw is present in a material. In other words, it is considered that, in JP-A 2006-44982, destruction of the AlGaN substrate is prevented by making the expansion of the cracks unlikely to occur on the assumption that a microscopic flaw is generated in an AlGaN substrate. However, the microscopic flaw (crack) which does not result in the destruction may be included in a GaN free-standing substrate which is made emphasizing on enhancing the fracture toughness as described in JP-A 2006-44982. Such a microscopic flaw (crack) can cause the breakage of the substrate when growing crystal on the GaN free-standing substrate at a high temperature or subsequently applying a device process.

Therefore, it is an object of the invention to provide a nitride semiconductor free-standing substrate in which flaws (cracks) causing destruction of nitride semiconductor single crystal is less likely to be generated, a method of manufacturing the same and a nitride semiconductor device.

(1) According to one embodiment of the invention, a nitride semiconductor free-standing substrate comprises:
a diameter of not less than 40 mm;
a thickness of not less than 100 μm;
a dislocation density of not more than $5 \times 10^6/cm^2$;
an impurity concentration of not more than $4 \times 10^{19}/cm^3$; and
a nanoindentation hardness of not less than 19.0 GPa at a maximum load in a range of not less than 1 mN and not more than 50 mN.

In the above embodiment (1), the following modifications and changes can be made.
(i) The nitride semiconductor free-standing substrate further comprises a surface inclined from a C plane in a range of not less than 0° and not more than 5°.
(ii) The nitride semiconductor free-standing substrate further comprises a surface inclined from an M plane in a range of not less than 0° and not more than 5°.
(iii) A direction of a crystal axis facing a direction closest to a normal line with respect to a surface of the substrate at each point in plane of the substrate comprises a dispersion of not more than 0.1° per 10 mm length along the surface of the substrate.
(iv) The nitride semiconductor free-standing substrate further comprises a surface that an rms value in a 10 μm square region is not more than 3 nm.

(2) According to another embodiment of the invention, a method of manufacturing a nitride semiconductor free-standing substrate comprises:
a single crystal preparation step for preparing a nitride semiconductor single crystal with a diameter of not less than 40 mm and a thickness of not less than 100 μm;
a coating step for forming a coated substrate by entirely coating front, back and side surfaces of the nitride semiconductor single crystal with a protective film;
a heat treatment step for applying heat treatment to the coated substrate under a temperature higher than 1300° C. for not less than 20 hours; and
a substrate formation step for forming a nitride semiconductor free-standing substrate by removing the protective film from the coated substrate having passed through the heat treatment step.

In the above embodiment (2), the following modifications and changes can be made.
(v) The coating step comprises as the protective film one selected from an AlN film, a BN film, a Si oxide film, a Si nitride film and a SiC film that are amorphous.

(3) According to another embodiment of the invention, a method of manufacturing a nitride semiconductor free-standing substrate comprises:
a single crystal formation step for forming nitride semiconductor single crystal with a diameter of not less than 40 mm and a thickness of not less than 100 μm by growing in a heated state;
a Si nitride film formation step performed immediately after the single crystal formation step for forming a Si nitride film of not less than 0.001 molecular layer in thickness on a surface of the nitride semiconductor single crystal at around a growth temperature;
a cooling step for cooling the nitride semiconductor single crystal having the Si nitride film formed thereon to a room temperature; and
a substrate formation step performed after the cooling step for forming a nitride semiconductor free-standing substrate by removing the Si nitride film.

In the above embodiment (3), the following modifications and changes can be made.
(vi) In the Si nitride film formation process, the Si nitride film of not less than 0.018 molecular layer in thickness is formed.

(4) According to another embodiment of the invention, a nitride semiconductor device comprises:
the nitride semiconductor free-standing substrate according to the above embodiment (1).

(5) According to another embodiment of the invention, a nitride semiconductor device comprises:
the nitride semiconductor free-standing substrate manufactured by the method of the above embodiment (2) or (3).

Advantages of the Invention

According to one embodiment of the invention, a nitride semiconductor free-standing substrate that flaws (or cracks) causing the destruction of nitride semiconductor single crystal is less likely to be generated, a method of manufacturing the same and a nitride semiconductor device using the same can be provided.

BRIEF DESCRIPTION OF THE DRAWINGS

Next, the present invention will be explained in more detail in conjunction with appended drawings, wherein.

DESCRIPTION OF THE PREFERRED EMBODIMENTS

Summary of the Embodiment

Figure 1A:
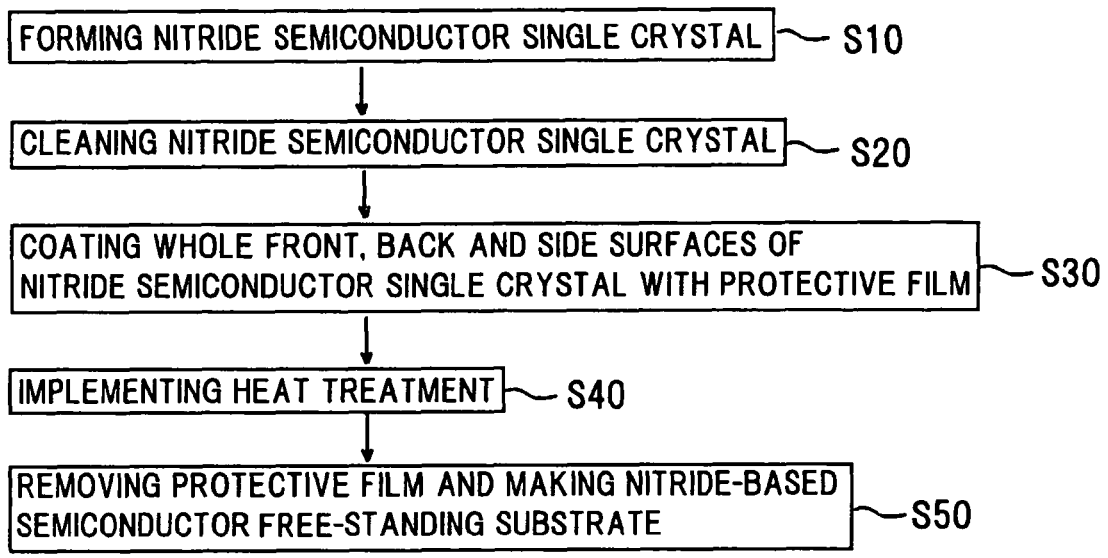
FIG. 1A is a diagram showing a flow of manufacturing processes of a nitride semiconductor free-standing substrate in a preferred embodiment of the invention.

As a nitride semiconductor free-standing substrate used for manufacturing a device, a nitride semiconductor free-standing substrate having a diameter of 40 mm or more, a thickness of 100 μm or more, dislocation density of $5 \times 10^6/\text{cm}^2$ or less, an impurity concentration of $4 \times 10^{19}/\text{cm}^3$ or less and nanoindentation hardness of 19.0 GPa or more at the maximum load within a range of not less than 1 mN nor more than 50 mN is provided. The manufacturing method of the nitride semiconductor free-standing substrate used for manufacturing a device includes a single crystal preparation process for preparing nitride semiconductor single crystal having a diameter of 40 mm or more and a thickness of 100 μm or more, a coating process for forming a coated substrate by entirely coating front, back and side surfaces of the nitride semiconductor single crystal with a protective film, a heat treatment process for applying heat treatment to the coated substrate under a temperature higher than 1300° C. for 20 hours or more, and a substrate formation process for forming a nitride semiconductor free-standing substrate by removing the protective film from the heat treated coated substrate.

Furthermore, the manufacturing method of the nitride semiconductor free-standing substrate used for manufacturing a device includes a single crystal formation step for forming nitride semiconductor single crystal having a diameter of 40 mm or more and a thickness of 100 μm or more by growing in a heated state, a Si nitride film formation step performed immediately after the single crystal formation step for forming a Si nitride film having a thickness of 0.001 molecular layer or more on a surface of the nitride semiconductor single crystal at around a growth temperature, a cooling step for cooling the nitride semiconductor single crystal having the Si nitride film formed thereon to a room temperature, and a substrate formation step performed after the cooling step for forming a nitride semiconductor free-standing substrate by removing the Si nitride film. Here, the front surface indicates a crystal growth surface and the back surface indicates a surface opposite to the crystal growth surface.

In the present embodiment, "hardness" is small means that the nitride semiconductor single crystal is likely to be plastically deformed. In other words, the "hardness" in the present embodiment is a measure to indicate the anti-plastic deformation property which causes the generation of flaws in the nitride semiconductor single crystal, and when the nitride semiconductor single crystal is "hard" in the meaning described in the present embodiment, the flaws which causes destruction of the nitride semiconductor single crystal is less likely to be generated.

Knowledge of the Inventor

The nitride semiconductor free-standing substrate, the method of manufacturing the same and the nitride semiconductor device in the present embodiment are based on the following knowledge that the inventors obtained. In the following explanation, gallium nitride (GaN) will be explained as an example of a nitride semiconductor.

The inventor keenly examined in order to improve low process yield of the GaN free-standing substrate. As a result, it was found that, by applying a below-described annealing process after growing GaN single crystal which is a base of a GaN free-standing substrate, or by depositing a Si nitride film on a surface of single crystal immediately after growing the GaN single crystal, it is possible to manufacture a GaN free-standing substrate having low dislocation density ($\leq 5 \times 10^6/\text{cm}^2$), a low impurity concentration ($\leq 4 \times 10^{19}/\text{cm}^3$) and practical hardness, i.e., hardness of 19.0 GPa or more. Thus, the knowledge such that it is possible to significantly improve the process yield at the time of manufacturing the GaN free-standing substrate even if the GaN single crystal is large and thick (i.e., diameter≥40 mm and thickness≥100 μm) was obtained.

As described above, the original reason why the GaN single crystal is broken or cracks are generated during the processing is that crystal is plastically deformed by a combined stress of the residual stress in the GaN single crystal and a stress generated by force applied to the GaN crystal during the process, and microscopic flaws are generated when deformation volume exceeds a critical point. From this reason, in order to prevent breakage or cracks in the GaN single crystal, it is only need to make the plastic deformation unlikely to be generated in the GaN single crystal. Furthermore, for this purpose, it is important to prevent the generation of the dislocation which causes the plastic deformation, and when the dislocation is already present, to impede the motion thereof.

High dislocation density or high impurity concentration in the GaN single crystal represents impediment of the dislocation motion, and since a dislocation network or the impurity impedes the dislocation motion inside the GaN crystal, the plastic deformation in the GaN crystal is less likely to be generated. On the other hand, when the dislocation density and the impurity concentration in the GaN single crystal are low, there is no such a factor which impedes the dislocation motion, hence, it is important to prevent generation of new dislocation which causes the plastic deformation. A Frank-Read source or vacancy coalescence, etc., are considered as a mechanism that the dislocation is newly multiplied in the GaN single crystal. The Frank-Read source is a dislocation line with a limited length confined in a slip plane. Breakability of the GaN free-standing substrate in the present embodiment is correlated with the nanoindentation hardness as described above, which is hardness when pushing an indenter with a μm-size tip diameter into crystal. Since a distance between dislocations is about 20 μm when the dislocation density of GaN is $5 \times 10^6/\text{cm}^2$, it is unlikely that the Frank-Read source caused by the dislocation affects the nanoindentation hardness, thus, it is also unlikely that this causes breakages or cracks in the GaN free-standing substrate.

On the other hand, if the GaN crystal includes the large amount of vacancies, it is considered that, when a stress is generated in the GaN crystal by applying a force due to the process or a force due to the nanoindentation, etc., the vacancies are coalesced for decreasing stress energy at a position where the stress is maximized. A two-dimensional plane is formed by the coalesced vacancies, which results in a dislocation loop. In other words, it is considered that the higher a vacancy concentration in the GaN crystal, the more likely it is that the dislocation loop is generated and multiplied by the stress and the plastic deformation occurs.

Inversely, if it is possible to reduce the vacancy concentration in the GaN crystal, it is possible to suppress the generation and multiplication of the dislocation due to the stress, and to make the plastic deformation unlikely to occur.

A Ga vacancy in the GaN crystal is a source of yellow luminescence observed around 550 nm by photoluminescence (PL) measurement. Focusing on this point, the inventors searched treatment in which, while judging the level of a Ga vacancy concentration in the GaN crystal with reference to yellow luminescence intensity, it is possible to reduce the Ga vacancy concentration by applying various treatments to the GaN single crystal (i.e., treatment for reducing the yellow luminescence intensity). Although positron annihilation measurement is known as a method of directly measuring the vacancy concentration in the GaN crystal, since a large-scale test facility and a large amount of cost are required for measuring, only increase and decrease in the yellow luminescence intensity measured by the PL method is focused in the present embodiment.

As a result of applying various treatments to a practical GaN free-standing substrate having low dislocation density ($\leq 5 \times 10^6/cm^2$) and a low impurity concentration ($\leq 4 \times 10^{19}/cm^3$) based on the above-mentioned knowledge for reducing the Ga vacancy concentration in the crystal, the inventors found following two types of methods. As the above expectation, the knowledge that the hardness of the GaN single crystal increases in accordance with the decrease in the yellow luminescence intensity of the PL, that it is possible to manufacture GaN single crystal having hardness of 19.0 GPa or more, or 21.0 GPa or more depending on the treatment condition, and that it is possible to improve the process yield at the time of manufacturing the GaN free-standing substrate, was obtained by each method.

Firstly, a first method is a method in which GaN single crystal of which hardness after the crystal growth is smaller than 19.0 GPa is annealed at a temperature higher than 1300° C. for 20 hours or more. In the first method, a protective film formed of an amorphous film such as an AlN film, an BN film, a Si oxide film, a Si nitride film or a SiC film is deposited on a surface of the GaN single crystal before annealing. A second method is a method in which a surface of the GaN single crystal is coated with a Si nitride film having a thickness of 0.001 molecular layer or more at a high temperature around a growth temperature ($\geq 800°$ C.) immediately after stopping the growth of the GaN single crystal. The inventors found that the GaN single crystal made by the second method has low yellow luminescence intensity and the hardness of 19.0 GPa or more even without applying the annealing treatment described for the first method.

Effects of the First and Second Methods

The reason why the first and second methods are effective will be explained hereinafter together with a mechanism that Ga vacancies are introduced into the GaN crystal.

Firstly, the effect of the second method will be explained. It is considered that, even when the Si nitride film is not formed, the amount of the Ga vacancies introduced into the GaN crystal during the growth is small and the most of the Ga vacancies are introduced after stopping the growth while the temperature is still high including during cooling. Since the growth temperature in the HVPE method used by the inventors was 800-1200° C. and, only when a Si nitride film is formed immediately after stopping the growth, the Ga vacancies are reduced and the hardness of the GaN single crystal increases, it is considered that the Ga vacancies are easily introduced into the GaN single crystal at least at a high temperature of 800° C. or more when the Si nitride film does not exist on a surface which is a crystal growth surface. At that time, a position where the Ga vacancies are generated is more likely to be in the vicinity a dislocation core on a crystal surface in which constituent atoms of the crystal can most freely move. Since Ga is continuously supplied to the surface during the growth, vacancies are less likely to be formed because, even if Ga vacancies are formed on the surface, the Ga vacancies are immediately filled. However, when the growth is stopped, supply of a raw material is also stopped, thus, the vacancy becomes likely to be formed. It is considered that the generated Ga vacancies immediately move into the crystal along the dislocation which already exists nearby, and the vacancies are introduced into the entire crystal due to the dislocation which is a source of vacancies.

On the other hand, when the Si nitride film is formed immediately after the growth, it is considered that many dangling bonds existing in the dislocation core are terminated by the Si nitride film, and the generation of the vacancy is thereby suppressed. It is considered that the reason why the effect is obtained even the thickness of the Si nitride film is 0.001 molecular layer is that the Si nitride is selectively precipitated on the dislocation core which is a source of the vacancy. This is because a position of the dislocation core with more dangling bonds becomes the most stable adsorption site of Si atoms which are migrating on the surface.

Next, the reason why the Ga vacancy concentration decreases and the hardness of the GaN single crystal increases by the first method will be considered. It is considered that a function of the protective film in this case is to prevent evaporation of the GaN single crystal during the high-temperature annealing, and to prevent generation of new vacancies during the annealing by terminating excessive dangling bonds which exist at the dislocation core in the amorphous material. However, although details will be described later, it was revealed that, even if a material which is simply amorphous and resistant to high temperature, e.g., a carbon film or an Ir film, etc., is used as a protective film, there is no effect of reducing the Ga vacancy concentration. On the other hand, when a material containing an atom easily replaceable with a Ga atom in the Ga crystal, such as Al, B or Si, e.g., an AlN film, an BN film, a Si oxide film, a Si nitride film or a SiC film, etc., was annealed as a protective film, the Ga vacancy concentration decreased and it was possible to improve the hardness of the GaN single crystal. Thus, it is considered that, when these protective films are used, besides the above-mentioned prevention of the evaporation and the generation of new vacancies, the mechanism to eliminate the Ga vacancies functions due to the constituent atoms of the protective film which are diffused into the GaN crystal by the high temperature during the annealing and reaches a Ga vacancy position. It is considered that the reason why the temperature higher than 1300° C. is required in the first method unlike the second method is that, since the constituent atoms of the protective film are diffused into the crystal, the high temperature is required.

In addition, the inventors confirmed that the above-mentioned two methods are efficient for manufacturing not only a GaN free-standing substrate but also an AlN free-standing substrate. The nitride semiconductor free-standing substrate in the embodiment of the invention is preferable for growing a light-emitting diode, a laser diode, a photodetector or a transistor structure by a thin film growth method such as a MOVPE method, and it is thereby possible to reduce the cost of light-emitting, photodetector and electronic devices using the nitride semiconductor free-standing substrate.

Embodiments of the invention will be explained in detail hereinafter.

Embodiments

The nitride semiconductor free-standing substrate in the present embodiment has a diameter of 40 mm or more, a thickness of 100 μm or more, dislocation density of $5\times10^6$/cm$^2$ or less, an impurity concentration of $4\times10^{19}$/cm$^3$ or less, and nanoindentation hardness of 19.0 GPa or more at the maximum load within a range of not less than 1 mN nor more than 50 mN. As a nitride semiconductor, for example, GaN or MN is included. The nitride semiconductor free-standing substrate in the present embodiment can be applied to the growth of a light-emitting diode (LED), a laser diode (LD), a photodetector (PD) or a transistor structure which are grown by a thin film growth method such as a metal organic vapor phase epitaxy (MOVPE method). In other words, it is possible to manufacture a light-emitting device, a photodetector device or an electronic device by forming a compound semiconductor layer having a predetermined structure on the nitride semiconductor free-standing substrate in the present embodiment. In addition, the nitride semiconductor free-standing substrate in the present embodiment preferably has the nanoindentation hardness of 20.0 GPa or more at the maximum load within a range of not less than 1 mN nor more than 50 mN, more preferably 20.5 GPa or more, and further preferably 21.0 GPa or more.

From a viewpoint of application to a device, the nitride semiconductor free-standing substrate, e.g., a GaN free-standing substrate preferably has an impurity concentration of $3\times10^{18}$/cm$^3$ or less, and more preferably, $1\times10^{18}$/cm$^3$ or less. The most preferable impurity concentration is $5\times10^{17}$/cm$^3$ or less. In addition, from a viewpoint of application to a device, the lower the dislocation density of the nitride semiconductor free-standing substrate, e.g., a GaN free-standing substrate, the more preferable it is, thus, the dislocation density is preferably $3\times10^6$/cm$^2$ or less, and more preferably, $1\times10^6$/cm$^2$ or less. The most preferable dislocation density is $5\times10^5$/cm$^2$ or less.

In the present embodiment, it is preferable that the nitride semiconductor free-standing substrate, e.g., a GaN free-standing substrate is n-type and a carrier concentration thereof is $4\times10^{19}$/cm$^3$ or less. It is possible to use Si, O, Ge, Se or Te, etc., as an n-type impurity. In addition, in the present embodiment, it is preferable that the nitride semiconductor free-standing substrate, e.g., a GaN free-standing substrate is p-type and a p-type impurity concentration thereof is $4\times10^{19}$/cm$^3$ or less. It is possible to use Mg, Zn, Be, or C etc., as a p-type impurity.

In addition, resistivity of the nitride semiconductor free-standing substrate may be semi-insulating, which is $1\times10^5$ Ωcm or more. For example, in order that the nitride semiconductor free-standing substrate in the present embodiment is semi-insulating, a p-type impurity such as Fe, Zn, Be or C for forming a deep level may be added to the nitride semiconductor at an amount that does not impart conductivity to the nitride semiconductor free-standing substrate.

Furthermore, the nitride semiconductor free-standing substrate is preferably formed having a surface inclined from a C plane in a range of not less than 0° nor more than 5°. In addition, although an inclination direction of the surface is preferably an M axis direction, it may be an A axis direction or a direction between the M and A axis directions. In addition, the nitride semiconductor free-standing substrate can be formed having a surface inclined from an M plane in a range of not less than 0° nor more than 5°. In this case, although an inclination direction of the surface is preferably an A or C axis direction, it may be a direction between the A and C axis directions.

In addition, a direction of a crystal axis facing a direction closest to a normal line with respect to a substrate surface at each point in the substrate plane preferably has dispersion of 0.1° or less per 10 mm in length along the substrate surface. It is more preferable that the dispersion is 0.05° or less per 10 mm.

The definition of the dispersion of the crystal axis (per 10 mm) in the present embodiment is as follows. Firstly, a direction nearly vertical to the substrate surface is selected. A crystal axis having small Miller indices, such as a C axis, an A axis or an M axis, is common for the crystal axis, however, it may be a crystal axis having large Miller indices which is an intermediate thereof. Next, a direction of the above-mentioned crystal axis is measured at a measurement point on the substrate which is currently focused, thereby determining a vector which indicates a direction of the crystal axis with respect to the substrate surface. The measurement is implemented for each point on a straight line of 10 mm in length along the surface, thereby determining a vector which indicates a direction of the above-mentioned crystal axis at each point. When origins of the all vectors are matched, a circular cone which includes all vectors therein is expected. Among such circular cones, a size of an apex angle of the circular cone having the smallest opening angle at the apex is determined as dispersion of the crystal axis.

In addition, the nitride semiconductor free-standing substrate in the present embodiment preferably has a surface in which an rms value in a 10 μm square region is 3 nm or less.

Method of Manufacturing Nitride Semiconductor Free-standing Substrate

Figure 1B:
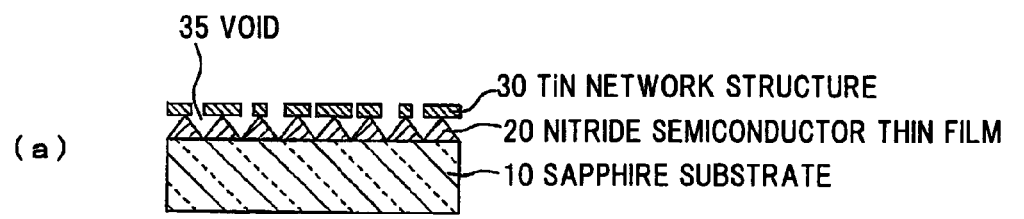
FIG. 1B is a diagram showing a flow of manufacturing processes of nitride semiconductor single crystal in the embodiment of the invention.
Figure 1B:
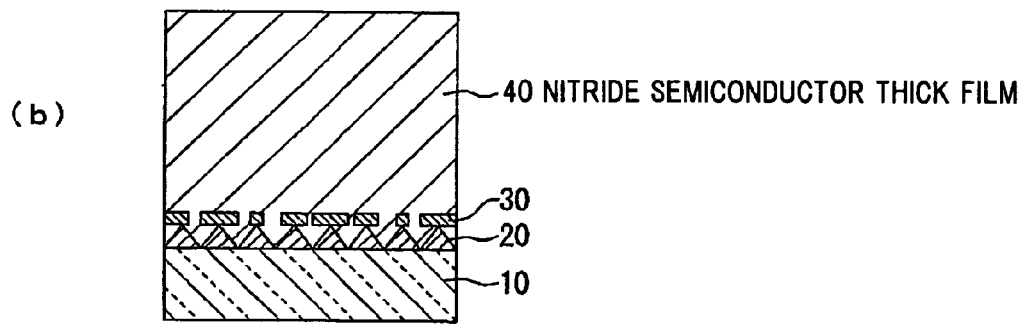
Figure 1B:
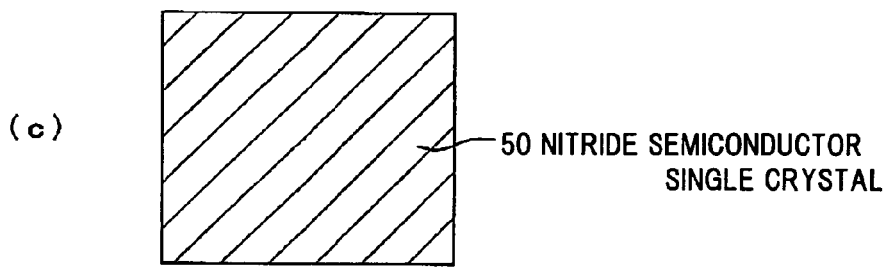

FIG. 1A shows an example of a flow of manufacturing processes of a nitride semiconductor free-standing substrate in the embodiment of the invention and FIG. 1B shows an example of a flow of manufacturing processes of nitride semiconductor single crystal in the embodiment of the invention.

A front surface of a nitride semiconductor single crystal, which has a diameter of 40 mm or more, a thickness of 100 μm or more, dislocation density of $5\times10^6$/cm$^2$ or less, an impurity concentration of $4\times10^{19}$/cm$^3$ or less and nanoindentation hardness of 19.0 GPa or more at the maximum load within a range of not less than 1 mN nor more than 50 mN, is ground/polished, and grinding, polishing and external form grinding processes, etc., are applied to the back surface thereof, thereby manufacturing the nitride semiconductor free-standing substrate in the present embodiment.

In detail, firstly, nitride semiconductor single crystal in a disc shape having a diameter of 40 mm or more and a thickness of 100 μm or more is prepared (a single crystal preparation process: a step 10, hereinafter, a step is described as "S"). For example, as shown in FIG. 1B(a), a nitride semiconductor thin film 20 is grown on a sapphire substrate 10 using a MOVPE method, etc. Then, a Ti layer is deposited on the nitride semiconductor thin film 20, and a void 35 is formed in the nitride semiconductor thin film 20 while converting the Ti layer on the nitride semiconductor thin film 20 into a TiN network structure 30 by heat treatment in hydrogen and ammonia.

Next, as shown in FIG. 1B(b), a nitride semiconductor thick film 40 is grown on the TiN network structure 30 using the HVPE method, etc. Subsequently, as shown in FIG. 1B(c), a nitride semiconductor single crystal 50 is made by removing the sapphire substrate 10 from the void portion (the VAS method). Next, after cleaning the nitride semiconductor single crystal 50 using organic solvent, a surface of the nitride semiconductor single crystal 50 after the cleaning is treated by inorganic acid, thereby removing contaminants from the surface (a cleaning process: S20). Following this, front, back and side surfaces of the nitride semiconductor single crystal 50 are entirely coated with a protective film, thereby forming a coated substrate (a coating process: S30). Here, the protective film preferably contains any one selected from a group consisting of an AlN film, a BN film, a Si oxide film, a Si nitride film and a SiC film which are amorphous. The protective film is not limited to the above example as long as it is a material which is amorphous, is resistant to a below-described annealing temperature, and contains an element easily replaceable with, e.g., Ga in the GaN crystal.

Next, heat treatment under a temperature higher than 1300° C. for 20 hours or more, i.e., annealing is applied to the coated substrate (a heat treatment process: S40). The heat treatment temperature is preferably higher than 1400° C., more preferably higher than 1500° C., and most preferably higher than 1600° C. The annealing in the heat treatment process is preferably performed in an inert gas such as any of nitrogen, argon or helium, or a mixed gas thereof. The heat treatment process can be performed in, e.g., hydrogen or a gas having ammonia added thereto unless the protective film is attacked.

Sequentially, the protective film is removed from the coated substrate having passed through the heat treatment process, and the nitride semiconductor free-standing substrate is formed (a substrate formation process: S50). For example, after slicing the coated substrate which is coated with the protective film, an exposed surface is ground/polished, thereby forming the nitride semiconductor free-standing substrate.

Figure 2:
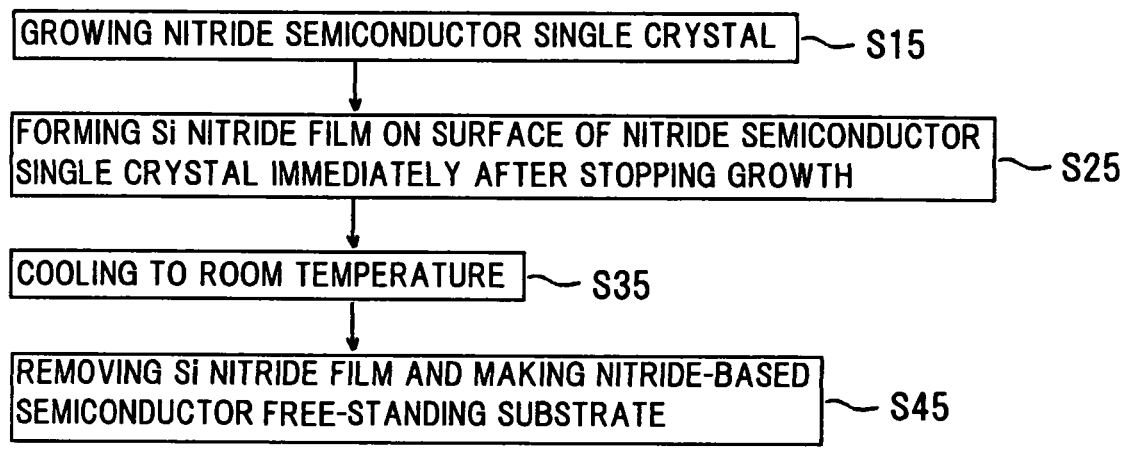
FIG. 2 is a diagram showing a flow of manufacturing processes of a nitride semiconductor free-standing substrate in a modification of the embodiment of the invention.

FIG. 2 shows an example of a flow of manufacturing processes of a nitride semiconductor free-standing substrate in a modification of the embodiment of the invention.

Firstly, nitride semiconductor single crystal in a disc shape having a diameter of 40 mm or more and a thickness of 100 μm or more is grown at a high temperature using the VAS method, etc. (a single crystal formation process: S15). The details of the VAS method are as described above. Next, after the single crystal formation process, specifically, immediately after the growth of the nitride semiconductor single crystal, a Si nitride thin film having a thickness of 0.001 molecular layer or more is formed on a surface of the nitride semiconductor single crystal at around the growth temperature (a Si nitride film formation process: S25). The thickness of the Si nitride film formed in the Si nitride film formation process is preferably 0.018 molecular layer or more, more preferably, 0.15 molecular layer or more. Furthermore, the thickness of the c is most preferably 1.2 molecular layer or more.

Following this, the nitride semiconductor single crystal having the Si nitride film formed thereon is cooled to the room temperature (a cooling process: S35). After the cooling process, the Si nitride film is remover and the nitride semiconductor free-standing substrate is formed (a substrate formation process: S45).

Effects of the Embodiments

According to the nitride semiconductor free-standing substrate in the present embodiment, it is possible to obtain thick (i.e., thickness≥100 μm) nitride semiconductor single crystal having a large area (i.e., diameter≥40 mm), low dislocation (≤5×10$^6$/cm$^2$) and a low impurity concentration (≤4×10$^{19}$/cm$^3$). As a result, according to the nitride semiconductor free-standing substrate in the present embodiment, a nitride semiconductor free-standing substrate having a practical thickness and size can be manufactured at a good process yield. Furthermore, according to the nitride semiconductor free-standing substrate in the present embodiment, it is possible to realize the low cost of a light-emitting device, a photodetector device and an electronic device using the nitride semiconductor free-standing substrate.

In addition, in the nitride semiconductor free-standing substrate in the present embodiment, the hardness of the nitride semiconductor single crystal can be improved, the generation of the microscopic flaw (crack) in the nitride semiconductor free-standing substrate can be suppressed, and when a predetermined compound semiconductor is epitaxially grown on the nitride semiconductor free-standing substrate and/or when the nitride semiconductor free-standing substrate is introduced into manufacturing processes of a predetermined device, a risk of generation of breakage in the nitride semiconductor free-standing substrate can be significantly reduced.

In addition, in the nitride semiconductor free-standing substrate in the present embodiment, since a vacancy concentration of group III atom in the nitride semiconductor free-standing substrate is significantly reduced compared to the prior art, when a device such as a LD, a LED or a transistor is made on the nitride semiconductor free-standing substrate by a crystal growth, etc., significant improvement in device properties and lifetime can be expected. Furthermore, since the nitride semiconductor free-standing substrate in the present embodiment is harder than the conventional nitride semiconductor free-standing substrate, risk of being broken during the process at the time of manufacturing the device is small, thus, a high process yield can be expected.

Further details will be explained hereinafter by Examples. Here, Comparative Example will be explained at first, and Examples of the invention will be subsequently explained.

COMPARATIVE EXAMPLE

In Comparative Example, n-type GaN single crystal doped with Si, of which surface is close to a Ga-polar C-plane, was made using the VAS method. The manufacturing of the GaN single crystal by the VAS method is as explained in FIG. 1B. In other words, firstly, a void substrate was prepared as a seed crystal substrate. The void substrate is a substrate in which a GaN thin film having a thickness of about 300 nm is grown on a sapphire substrate by the MOVPE method, etc., Ti is subsequently deposited on a surface of the GaN thin film, and a GaN layer is voided by heat treatment in hydrogen and ammonia while converting a Ti layer into a TiN network structure. The GaN layer was grown thick on the void substrate by the HVPE method, subsequently, free-standing GaN single crystal was obtained by removing the sapphire substrate from the void portion.

Here, a substrate having a surface inclined in an A or M axis direction from a C plane in a range of not less than 0.05° nor more than 1°, a thickness of 300-800 μm and a diameter of 35-160 mm was used as a sapphire substrate. The thickness of Ti at the time of manufacturing the above-mentioned void substrate was 5-100 nm. In addition, a crystal growth condition by the HVPE method was, e.g., substrate temperature: 800-1200° C., pressure: 10-120 kPa and growth rate: 30-100 μm/hr, and then, 50 μm-10 cm thick GaN single crystal was made. A GaCl gas, which was produced by spraying hydrochloric acid on metal gallium heated to 800° C. in a HVPE apparatus, was used as a group III material. In addition, a NH$_3$ gas was used as a group V raw material gas and a dichlorosilane gas was used as a Si material which is an n-type dopant. In addition, hydrogen, nitrogen or a mixed gas thereof was used as a carrier gas.

The dislocation density of the GaN single crystal is determined by the thickness of Ti at the time of manufacturing the void substrate. The thinner the Ti layer, the more likely it is that the dislocation in the GaN layer grown by the MOVPE propagates to a GaN thick film thereon, thereby high dislocation density. The dislocation density of the GaN single crystal obtained at the Ti thickness in a range of 5-100 nm is in a range of $1 \times 10^4$-$1 \times 10^8$/cm$^2$. In addition, the GaN single crystals used here were each in a mirror surface state with almost no pit on a surface after finishing the growth. As for an electron concentration in the GaN single crystal, crystal in a range of $1 \times 10^{15}$-$1 \times 10^{20}$ /cm$^3$ was prepared by adjusting a flow rate of dichlorosilane during the growth.

The GaN free-standing substrate having a diameter of 30-152 mm and a thickness of 80-600 μm was made by processing the GaN single crystal which was obtained by the above-mentioned method. When the original GaN single crystal was thinner than 2 mm, one GaN free-standing substrate was made from one single crystal by grinding and polishing front and back surfaces of the GaN single crystal. When the GaN single crystal was thicker than 2 mm, one GaN single crystal was divided into several pieces by slicing, and substantially, the front and back surfaces were ground and polished, thereby manufacturing plural GaN free-standing substrate.

Figure 3:
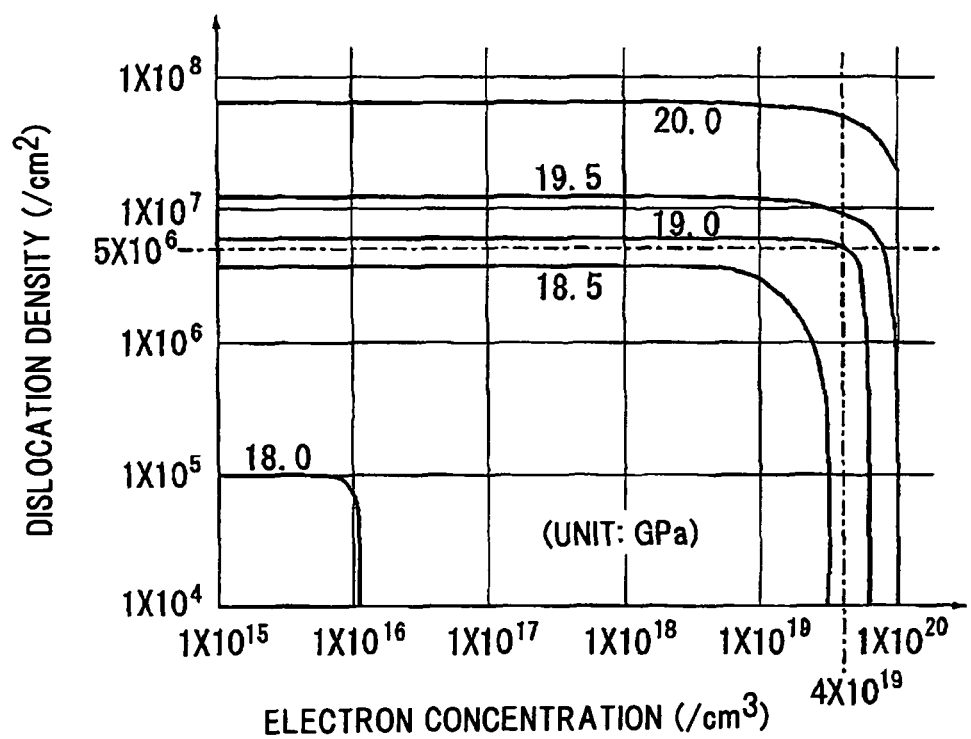
FIG. 3 is a diagram showing a relation among an electron concentration, dislocation density and hardness of GaN single crystal in Comparative Example.

FIG. 3 shows a relation among an electron concentration, dislocation density and hardness of GaN single crystal in Comparative Example.

In detail, FIG. 3 shows a relation among an electron concentration, dislocation density and nanoindentation hardness of GaN single crystal manufactured as described above. Results of the measurement on the GaN free-standing substrate after all processes were adopted as an electron concentration, dislocation density and nanoindentation hardness. The electron concentration was derived from Hall measurement and the dislocation density was derived from measuring the number of scotomas observed in cathodoluminescence image. In addition, the nanoindentation hardness was derived using a Berkovich-shape diamond indenter with a tip diameter of 50 nm at the maximum load which is set to a range of not less than 1 mN nor more than 50 mN.

In FIG. 3, a vertical axis is dislocation density, a horizontal axis is an electron concentration, and a continuous line in the graph indicates a contour line of the hardness. When the dislocation density was $5 \times 10^6$/cm$^2$ or less and the electron concentration was $4 \times 10^{19}$/cm$^3$ or less, the hardness of the GaN free-standing substrate (i.e., also the GaN single crystal) was smaller than 19.0 GPa, and when the dislocation density was more than $5 \times 10^6$/cm$^2$ or when the electron concentration was more than $4 \times 10^{19}$/cm$^3$, the hardness of the GaN free-standing substrate was 19.0 GPa or more.

Figure 4:
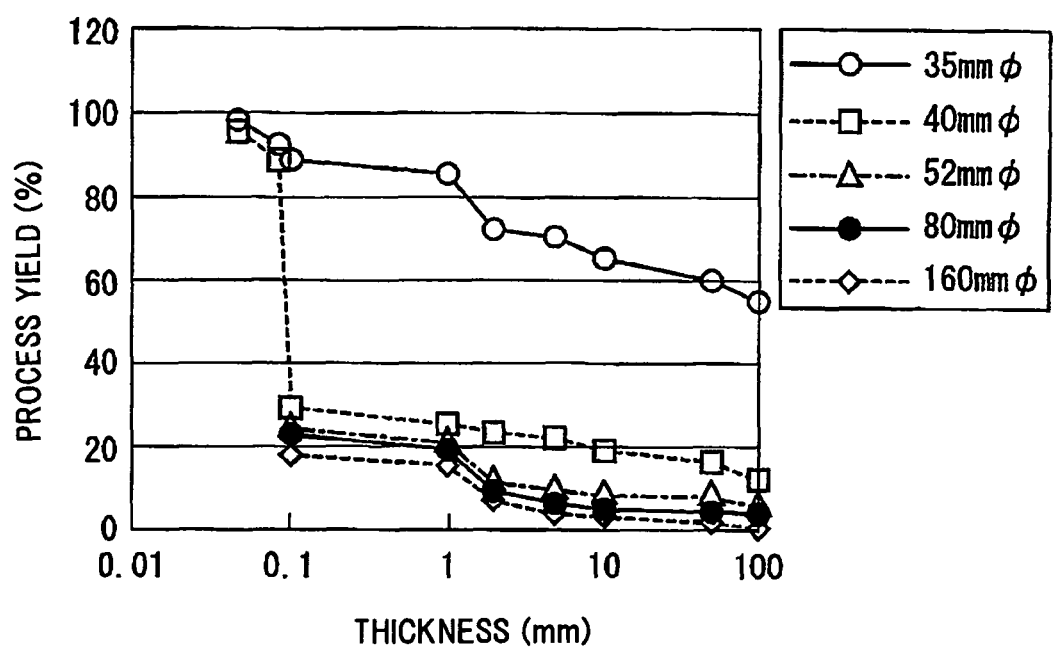
FIG. 4 is a diagram showing a relation among a diameter and a thickness of the GaN single crystal and a process yield in Comparative Example when hardness of a GaN free-standing substrate is 18.5 GPa.
Figure 5:
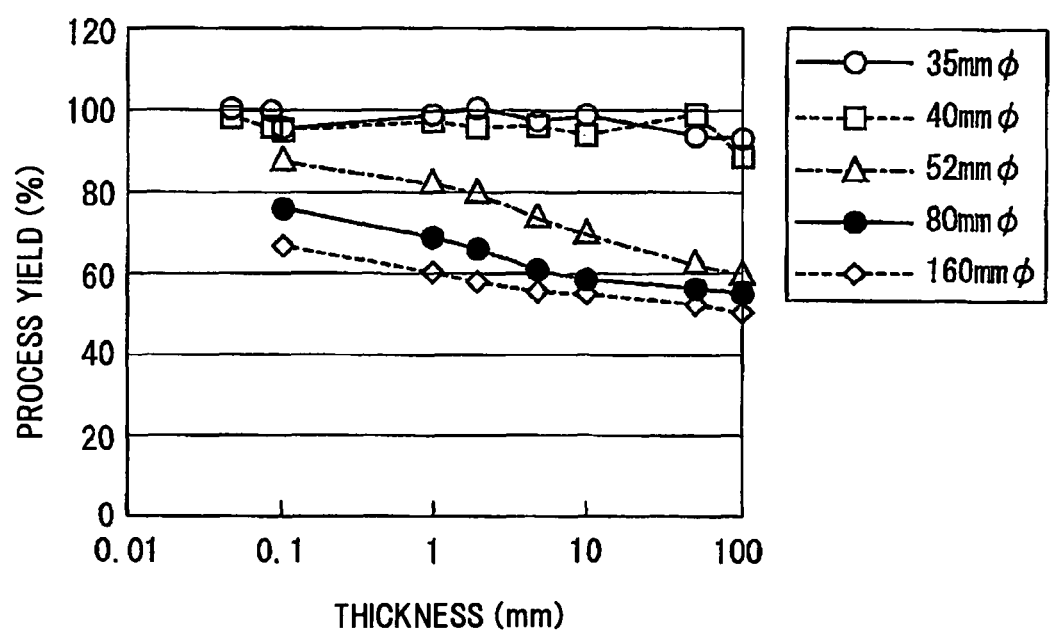
FIG. 5 is a diagram showing a relation among a diameter and a thickness of the GaN single crystal and a process yield in Comparative Example when the hardness of the GaN free-standing substrate is 20.0 GPa.

FIG. 4 shows a relation among a diameter and a thickness of the GaN single crystal and a process yield in Comparative Example when the hardness of the GaN free-standing substrate is 18.5 GPa and FIG. 5 shows a relation among a diameter and a thickness of the GaN single crystal and a process yield in Comparative Example when the hardness of the GaN free-standing substrate is 20.0 GPa.

Even when the GaN single crystal is soft (i.e., when the hardness is 18.5 GPa), a high process yield of about 90% was obtained in the case that the diameter is smaller than 40 mmφ and the thickness was smaller than 100 μm. However, in the case that the diameter is 40 mm or more and the thickness is 100 μm or more in the GaN single crystal, the process yield dropped drastically to 30% or less. On the other hand, when the GaN is hard (i.e., when the hardness is 20.0 GPa), the process yield of 50% or more was constantly obtained regardless of the diameter and thickness of the GaN free-standing substrate.

Figure 6:
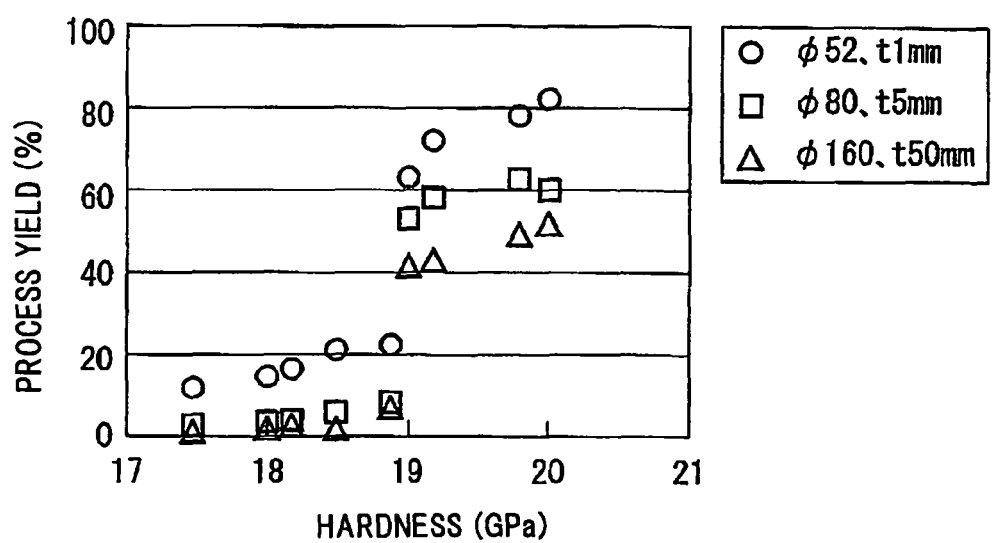
FIG. 6 is a diagram showing a relation between hardness of the GaN single crystal and a process yield in Comparative Example.

FIG. 6 shows a relation between hardness of the GaN single crystal and a process yield in Comparative Example.

In other words, FIG. 6 shows results of investigating how the process yield changes when the hardness of the GaN single crystal is different. The respective cases, when a 430 μm thick GaN free-standing substrate having a diameter of 50.8 mm is made from 1 mm thick GaN single crystal having a diameter of 52 mm, when a 530 μm thick GaN free-standing substrate having a diameter of 76.2 mm is made from 5 mm thick GaN single crystal having a diameter of 80 mm, and when a 530 μm thick GaN free-standing substrate having a diameter of 152.4 mm is made from 50 mm thick GaN single crystal having a diameter of 160 mm, are shown. The process yield drastically changes in each case when the hardness of the GaN single crystal crosses 19.0 GPa, and while the process yield is 22% or less when the hardness is smaller than 19.0 GPa, the process yield rapidly increases to 40% or more when the hardness is 19.0 GPa or more. Since whether or not GaN is broken is determined by a relationship between the maximum load on the GaN crystal during the process and the hardness of the GaN crystal, it is considered that the process yield shows a steep increase when crossing the hardness of 19.0 GPa, as shown in FIG. 6. Although three types of sizes of the GaN single crystal were shown in FIG. 6, the substantially same result has been obtained in the case of having other diameters and thicknesses, except in that an absolute value of the yield is slightly different.

From the above, it is understood that the hardness of the GaN single crystal is desirably 19.0 GPa or more in order to achieve certain degree of high process yield at the time of manufacturing the GaN free-standing substrate. However, as obvious from FIG. 3, in the GaN free-standing substrate manufactured in Comparative Example which has hardness of 19.0 GPa or more, the dislocation density is larger than $5 \times 10^6$/cm$^2$ or the electron concentration is larger than $4 \times 10^{19}$/cm$^3$. Since such high dislocation density or impurity concentration adversely affects performance or lifetime of the device, the GaN free-standing substrate having high dislocation and high impurity concentration cannot be applied to the actual device manufacturing.

Even in Comparative Example, the GaN free-standing substrate having the dislocation density of $5 \times 10^6$/cm$^2$ or less and the electron concentration of $4 \times 10^{19}$/cm$^3$ or less could be rarely obtained without breakage. However, when examining dispersion in the direction of the crystal axis vertical to a surface of the substrate, there was large dispersion of about 0.2° per 10 mm in length along the surface. When a light-emitting element is formed on the GaN free-standing substrate, the emission wavelength distribution thereof is affected by the dispersion in the direction of the crystal axis vertical to a surface. The dispersion is desirably 0.1° or less in order to form a LD and a LED at a good element yield, and from this point of view, the GaN free-standing substrate obtained in Comparative Example is not practical even having low dislocation and low impurity concentration. It is considered that the reason why the dispersion in the direction of the crystal axis vertical to a surface of the GaN free-standing substrate in Comparative Example is large is that the plastic deformation occurs during the process even though the GaN crystal is not broken.

In addition, when the surfaces of these substrates were examined by an atomic force microscope, it was revealed that an rms value in a 10 µm square region is very large, which is 20 nm or more. This is because microscopic cracks or bumps caused thereby are generated on the surface due to the plastic deformation during the process, thus, it was shown that the GaN free-standing substrate in Comparative Example is not practical also in this point of view.

Example 1

In Example 1, 5 mm thick GaN single crystal having a diameter of 80 mmϕ was grown by the VAS method in the same manner as Comparative Example, thereby making a 530 µm thick GaN free-standing substrate having a diameter of 76.2 mmϕ through the processes of grinding and polishing. However, Example 1 is different from Comparative Example in that the annealing treatment is applied before processing the GaN single crystal. In addition, the GaN single crystal manufactured in Example 1 was n-type, a carrier concentration thereof was $1 \times 10^{18}/cm^3$ and dislocation density was $2 \times 10^6/cm^2$, and when the annealing was not applied, hardness of the single crystal was 18.3 GPa.

In Example 1, the annealing was implemented by the following procedures. The GaN single crystal grown by the HVPE method was firstly cleaned by acetone and ethanol. Then, contaminants adhered on the surface of the GaN single crystal was removed in boiling nitrate. Next, the GaN single crystal was placed in a MOVPE apparatus and was subsequently heated to a temperature of 200-700° C., then, trimethylaluminum (TMA) and ammonia were supplied to the apparatus. Thus, a 100-1000 nm thick amorphous AlN film was formed as a protective film on the surface of the GaN single crystal. This process was performed several times by changing a method of placing the GaN single crystal in the MOVPE apparatus for entirely coating front, back and side surfaces of the GaN single crystal with the amorphous AlN film.

Next, the GaN single crystal coated with the amorphous AlN film was transferred to an annealing apparatus. Then, the annealing was implemented at a temperature of 1000-1710° C. for 1-50 hours while supplying nitrogen into the annealing apparatus under atmospheric pressure at a flow rate of 1-50 slm. After the annealing, the GaN single crystal was gradually cooled to 500° C. at a cooling rate of 150° C./hr. Then, the heater of the annealing apparatus was turned off and cooled to the room temperature.

After that, a GaN free-standing substrate was made by slicing, grinding and polishing the GaN single crystal coated with the AlN film. The AlN film is completely removed in the processing at the time of manufacturing the GaN free-standing substrate, and the finally obtained GaN free-standing substrate does not include the AlN film. In addition, as a GaN substrate, a substrate having a surface inclined from a C plane in an A or M axis direction or a direction therebetween in a range of 0°-5° was made. Since the inclination angle and the inclination direction of the surface did not obviously affect the following results, the results of all cases will be collectively shown below.

Figure 7:
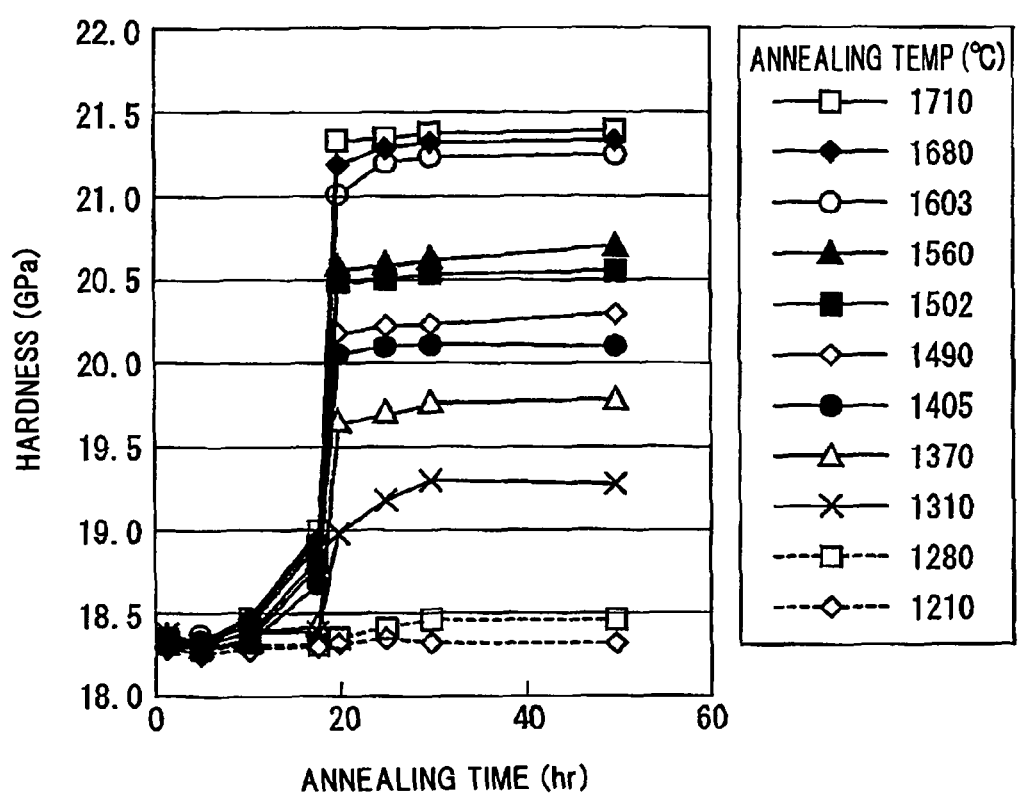
FIG. 7 is a diagram showing variations of the hardness of the GaN single crystal depending on annealing temperature and time in Example 1.

FIG. 7 shows variations of the hardness of the GaN single crystal depending on annealing temperature and time in Example 1.

In detail, FIG. 7 shows annealing temperature dependence and annealing time dependence of the hardness of the GaN single crystal (which is actuary measured after processed into a free-standing substrate) manufactured in Example 1. Since the result at the temperature of 1200° C. or less was substantially same as that at the temperature of 1210° C., it is omitted in FIG. 7. As shown in FIG. 7, when the annealing temperature is lower than 1300° C., a remarkable change in the hardness was not observed by the annealing up to 50 hours. On the other hand, when the annealing temperature exceeds 1300° C. and further the annealing time is 20 or more, the hardness of the GaN free-standing substrate increased rapidly. In addition, in this case, it was shown that the hardness tends to gradually increase when annealing time is over 20 hours and further longer. When annealing at 1310° C., 1405° C., 1502° C. and 1603° C. for 20 hours, the specific hardness values were respectively 19.0 GPa, 20.0 GPa, 20.5 GPa and 21.0 GPa.

Figure 8:
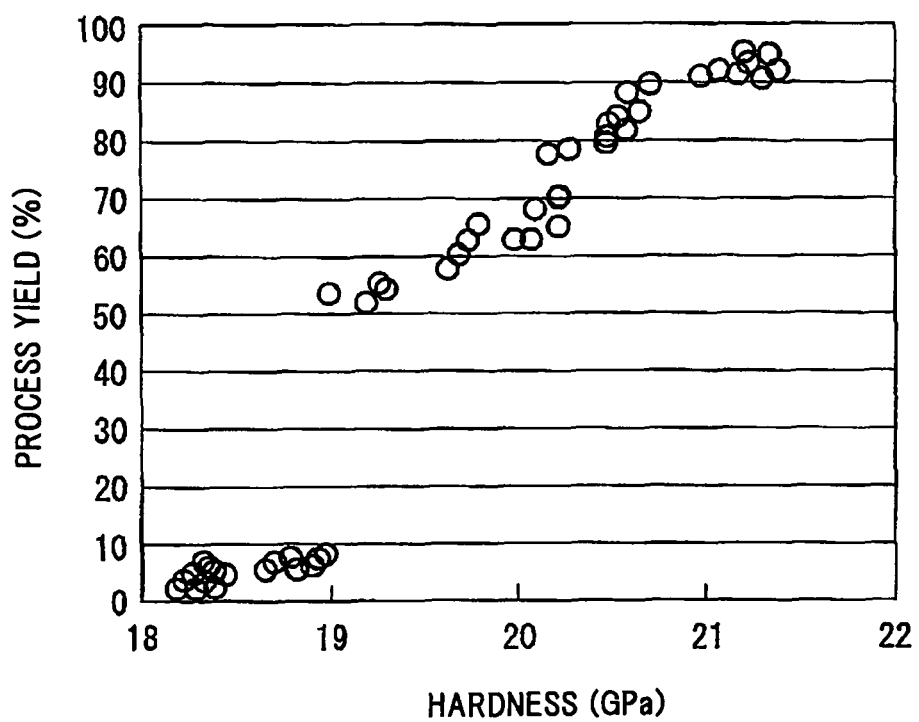
FIG. 8 is a diagram showing a relation between hardness of the GaN single crystal and a process yield in Example 1.

FIG. 8 shows a relation between hardness of the GaN single crystal and a process yield in Example 1.

As shown in FIG. 8, the process yield was improved with increasing the hardness of the GaN single crystal. The process yield was low value of 10% or less when the hardness was smaller than 19.0 GPa, and was improved to 50% or more at the hardness of 19.0 GPa or more, 60% at 20.0 GPa, 80% at 20.5 GPa and 90% at 21.0 GPa. When the hardness was 21.0 GPa or more, the process yield was substantially constant in a range of 90-95%.

Figure 9:
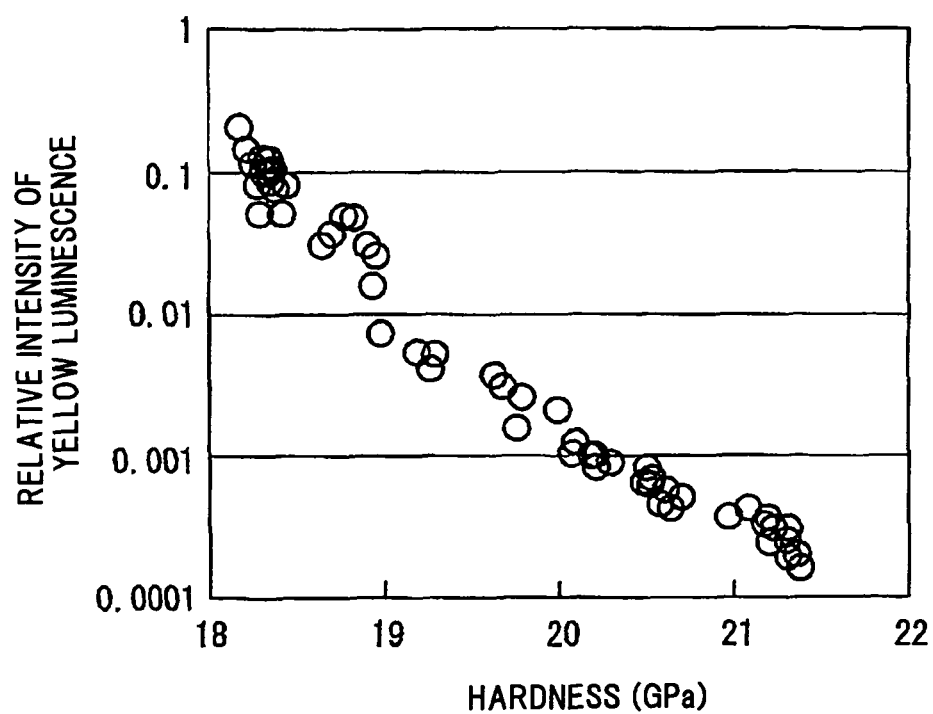
FIG. 9 is a diagram showing a relation between hardness of the GaN single crystal and relative intensity of yellow luminescence in Example 1.

FIG. 9 shows a relation between hardness of the GaN single crystal and relative intensity of yellow luminescence in Example 1.

In detail, FIG. 9 shows a result which summarizes PL measurement results of GaN free-standing substrate in Example 1 explained in FIGS. 7 and 8. In other words, FIG. 9 is a diagram showing yellow luminescence intensity at a position of a wavelength of 550 nm with respect to the hardness of the GaN single crystal, plotted by a relative value to band edge emission intensity. As obvious from FIG. 9, the relative intensity of yellow luminescence monotonically decreased in accordance with the increase in the hardness of the GaN free-standing substrate. As described above, since the yellow luminescence is luminescence caused by the Ga vacancy, the results in FIG. 9 shows that the Ga vacancy concentration in the crystal decreases in accordance with the increase in the hardness of the GaN free-standing substrate. It is expected that the higher the vacancy concentration in the crystal, the more likely it is that the plastic deformation is likely to occur due to the dislocation loop generated and multiplied by the stress, thereby decreasing the hardness of the crystal. Also in Example 1, it is considered that, the Ga vacancy concentration in the GaN single crystal decreased when the annealing was applied at 1300° C. or more for 20 hours or more, which results in that the process yield was improved by the improvement in the hardness of the GaN crystal.

In addition, as a mechanism that the Ga vacancy concentration in the GaN crystal is decreased by the annealing, the model considered is that constituent atoms of the protective film (Al atoms in Example 1) are diffused into the crystal during the annealing and reaches a Ga vacancy position. It is considered that the reason why the temperature higher than 1300° C. is required in Example 1 for improving the hardness by the annealing is that the temperature higher than 1300° C. is necessary to enhance the diffusion of the Al atoms in GaN crystal. In addition, it is necessary to diffuse the Al atoms to a deep region of the GaN single crystal (i.e., a region exposed by the processing) in order to increase the hardness of the GaN free-standing substrate, thus, as shown in FIG. 7, it is considered that it took about 20 hours until the effect of the annealing becomes evident.

Example 1 has been specifically explained for the case that a 530 µm thick GaN free-standing substrate having a diameter of 76.2 mmϕ is made from 5 mm thick n-type GaN single crystal having a diameter of 80 mmϕ, a carrier concentration of $1 \times 10^{18}/cm^3$ and dislocation density of $2 \times 10^6/cm^2$ through the slicing, grinding and polishing processes. In addition, the substantially same result as that of Example 1 was obtained also in the modification of Example 1. In other words, it was confirmed that, when a GaN free-standing substrate having a thickness in a range of 100-600 μm and a diameter in a range of 40-152.4 mm is manufactured from n-type GaN single crystal having a thickness in a range of 100 μm to 10 cm, a diameter in a range of 40-160 mm, a carrier concentration of $1 \times 10^{15}$-$4 \times 10^{19}/cm^3$ and dislocation density of $1 \times 10^4$-$5 \times 10^6/cm^2$ through the slicing, grinding and polishing processes, the substantially same result as that of Example 1 is obtained.

The above showed that it is possible to improve the process yield to 50% or more, which is more than the prior art, in the GaN free-standing substrate made in Example 1 having a diameter of 40 mm or more, a thickness of 100 μm or more, dislocation density of $5 \times 10^6/cm^2$ or less, an impurity concentration of $4 \times 10^{19}/cm^3$ or less and hardness of 19.0 GPa or more. Furthermore, it was shown that, by making the hardness of the GaN substrate 20.0 GPa, 20.5 GPa and 21.0 GPa, it is possible to further improve the process yield respectively to 60% or more, 80% or more and 90% or more.

In addition, when examining the dispersion in the direction of the crystal axis vertical to a surface of the GaN free-standing substrate which was obtained in Example 1 in the same manner as Comparative Example, the dispersion in the direction of the crystal axis vertical to the surface was 0.1° or less per 10 mm in length along the surface at the dislocation density of $5 \times 10^6/cm^2$ or less, and 0.05° or less at the dislocation density of $1 \times 10^6/cm^2$ or less, hence, the dispersion was significantly improved compared with Comparative Example, which is a value sufficient for the application to the LE or the LED, etc. This is a result of that the GaN crystal is hardened and the plastic deformation is suppressed. Furthermore, cracks or bumps caused by the plastic deformation which are seen in Comparative Example were not observed on the surface of the GaN free-standing substrate in Example 1, and an rms value in a 10 μm square region was 3 nm or less. This value is also sufficient for the application to the LE or the LED, etc.

Example 2

A GaN free-standing substrate in Example 2 was made in the same manner as in Example 1. In detail, the GaN free-standing substrates were made by variously changing types of protective films, deposition methods and conditions of a film. Here, an AlN film, a BN film, a Si oxide film, a Si nitride film, a SiC film, a carbon film and an Ir film were used as a protective film, and a MOVPE method, a plasma CVD method, a sputtering method and a sol-gel method were used as a deposition method. As a result, the same results as that of Example 1 were obtained in certain cases, and the increase in the hardness of the GaN crystal and the improvement in the process yield were not seen in other cases unlike Example 1.

In detail, the same result as that of Example 1 was obtained only when the protective film was the AlN film, the BN film, the Si oxide film, the Si nitride film, the SiC film which are amorphous. On the other hand, the improvement in the hardness of the GaN crystal was not observed in the AlN film, the BN film and the SiC film which are crystalline and in the carbon film and the Ir film regardless of whether crystalline or amorphous.

From the above results, it was shown that the hardness of the GaN crystal is improved by the above-mentioned first method only in the case of satisfying following three conditions: 1) the protective film at the time of annealing is resistant to the temperature and atmosphere during the annealing, 2) the protective film contains Al, B and Si, and 3) the protective film is an amorphous film. For example, when the AlN film is deposited at 800-1200° C. by the MOVPE method, the AlN film is crystalline, and the improvement in the hardness of the GaN crystal after the annealing or the improvement in the process yield was not seen. In addition, similarly to this, the improvement in the hardness of the GaN crystal was not seen when an amorphous carbon film was deposited at a low temperature of 300° C. by the sputtering method.

"2) The protective film contains Al, B and Si" means that the atoms entering a Ga vacancy site for eliminating vacancies during the annealing may be other than Al of Example 1 as long as the atom is easily replaceable with Ga atom (i.e., an impurity replaced with a group III atom at a group III site). In Example 2, although B and Si can be used besides Al, atoms other than B and Si can be used instead of Al as long as it is an atom easily replaceable with Ga. In addition, as for "3) the protective film is an amorphous film", it is considered that, when the protective film is crystalline, the protective film is epitaxially grown on the GaN single crystal which is a base. In this case, when the dislocation core exists on the surface of the GaN single crystal, the dislocation penetrates inside the protective film and reaches the surface thereof. Thus, when the film has crystallinity, the effect of suppressing the generation of vacancies by covering over the dislocation core with the protective film is not considered to be obtained.

Example 3

In Example 3, 5 mm thick GaN single crystal having a diameter of 80 mmφ was grown by the VAS method and was sliced, ground and polished in the same manner as Comparative Example, thereby making a 530 μm thick GaN free-standing substrate having a diameter of 76.2 mmφ. Similarly to Example 1, the GaN single crystal was n-type, the carrier concentration thereof was $1 \times 10^{18}/cm^3$ and the dislocation density was $2 \times 10^6/cm^2$. However, Example 3 is different from Example 1 in that dichlorosilane and ammonia which are Si material were introduced into the HVPE apparatus immediately after stopping the GaN growth in the HVPE apparatus and before starting cooling, and a Si nitride film is deposited on a surface of the GaN single crystal. In addition, the annealing after forming the protective film after the growth, which is implemented in Example 1, is not implemented. A thickness of the Si nitride film deposited after the growth was between 0.0001-30 molecular layer, a deposition rate was set to between 0.0001-1 molecular layer/minute and deposition time was between 1-30 seconds. The Si nitride film is removed in a process for manufacturing a GaN free-standing substrate.

Figure 10:
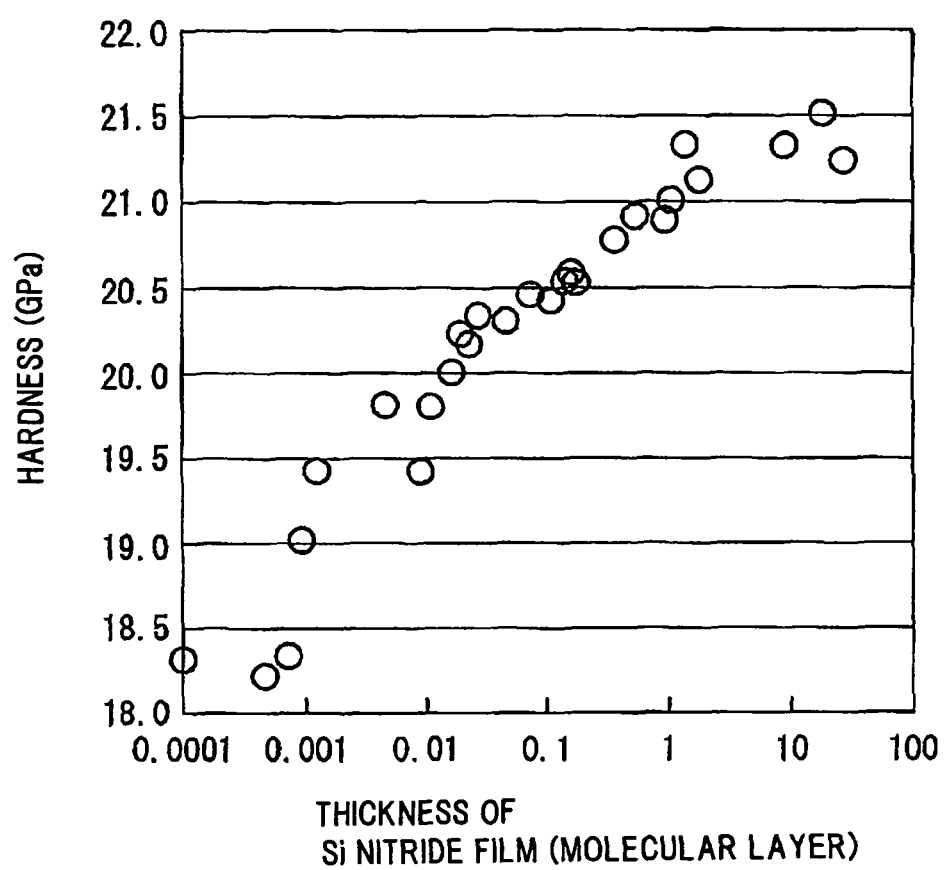
FIG. 10 is a diagram showing a relation between a thickness of a Si nitride film and hardness of the GaN single crystal during the manufacturing of a GaN free-standing substrate in Example 3.

FIG. 10 shows a relation between a thickness of a Si nitride film and hardness of the GaN single crystal during the manufacturing of a GaN free-standing substrate in Example 3.

As shown in FIG. 10, the hardness of the GaN free-standing substrate was improved with increasing the thickness of the Si nitride film. When the thickness of the Si nitride film was smaller than 0.001 molecular layer, the hardness of the GaN free-standing substrate was about 18.3 GPa similarly to Comparative Example, however, when the Si nitride film was 0.001 molecular layer or more, the hardness of the GaN free-standing substrate was 19.0 GPa or more. Further, with increasing the thickness of the Si nitride film from 0.018 molecular layer, 0.15 molecular layer and 1.2 molecular layer, the hardness of the GaN free-standing substrate increases from 20.0 GPa, 20.5 GPa and 21.0 GPa.

Figure 11:
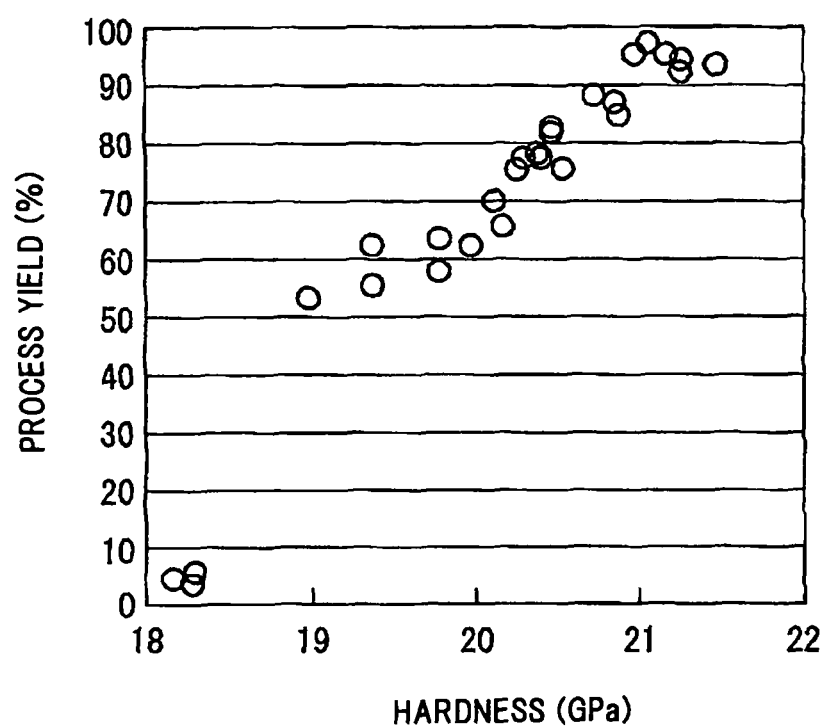
FIG. 11 is a diagram showing a relation between hardness of the GaN single crystal and a process yield in Example 3.

FIG. 11 shows a relation between hardness of the GaN single crystal and a process yield in Example 3.

In addition, as shown in FIG. 11, the process yield was improved with increasing the hardness of the GaN free-standing substrate in accordance with an increase in the thickness of the Si nitride film. Similarly to Comparative Example, the process yield was 10% or less when the thickness of the Si nitride film was smaller than 0.001 molecular layer and the hardness of the GaN free-standing substrate was smaller than 19.0 GPa, however, the process yield was improved to 50% or more when the thickness of the Si nitride film was 0.001 molecular layer or more and the hardness of the GaN was 19.0 GPa or more. In addition, the process yield of 60% or more was obtained when the hardness of the GaN free-standing substrate was 20.0 GPa, and when the hardness was 20.5 GPa or more and 21.0 GPa or more, the process yield further improved to 80% or more and 90% or more, respectively.

As a result of performing the PL measurement of the GaN free-standing substrate obtained in Example 3, it was revealed that the yellow luminescence intensity in PL decreases with increasing the hardness of the GaN free-standing substrate similarly to FIG. 9. From this point, it can be judged that the hardness of the GaN free-standing substrate also increased in Example 3 because the Ga vacancy concentration in the GaN crystal decreased. In other words, it was shown that it is possible to reduce the Ga vacancy concentration in the GaN single crystal by depositing the Si nitride film immediately after the GaN growth.

Considering from the high Ga vacancy concentration in the GaN single crystal after the growth in Comparative Example and Examples 1 and 2 together with the above results, it is believed that timing of generation of a large amount of Ga vacancies in the GaN crystal is not during the growth but after stopping the growth of GaN. In other words, it is described above that the Ga vacancy concentration in the GaN single crystal is reduced by the Si nitride film, however, in a precise sense, it is considered that it is possible to prevent the Ga vacancy from increasing by the nitride film. In Comparative Example and Examples 1 and 2, since the Si nitride film is not deposited immediately after stopping the growth, it is considered that the Ga vacancies increased during the cooling after stopping the growth.

It is considered that the increase in the Ga vacancy in the GaN crystal can be prevented by the Si nitride film because the Si nitride film covers the dislocation core and terminates dangling bonds present therein. As described above, many dangling bonds exist in the dislocation core and the Ga vacancy is likely to be generated. Even if the Ga vacancies are generated, they disappear immediately since Ga is constantly supplied during the crystal growth. However, if the growth is stopped, the generated Ga vacancies remain and are diffused inside the GaN crystal through the dislocation. As a result, a large amount of Ga vacancies are included in the obtained GaN single crystal. It is believed that, if the dislocation core is covered with the Si nitride film immediately after stopping the growth of GaN, it is possible to suppress the generation of the vacancies in the dislocation core and to prevent the Ga vacancy concentration from increasing.

In addition, it is considered that a consistent effect is obtained also in the case that the thickness of the Si nitride film is very thin, being 0.001 molecular layer, because the Si nitride film is selectively deposited on the dislocation core portion. This may be because Si preferentially adheres to the dislocation core portion having many dangling bonds. Furthermore, although the thickness of the Si nitride film is up to 30 molecular layer in FIG. 10, the hardness of the GaN single crystal is substantially constant and saturated when thickness of the Si nitride film is the 1.2 molecular layer or more, thus, it is believed that it is not necessary to further thicken the Si nitride film. However, considering from the above-mentioned mechanism of action of the Si nitride film, it is believed that there is no problem even if the Si nitride film is a thick film of 30 molecular layer or more.

Although Example 3 has been specifically explained for the case that the a 530 µm thick GaN free-standing substrate having a diameter of 76.2 mmϕ is made from 5 mm thick n-type GaN single crystal having a diameter of 80 mmϕ, a carrier concentration of $1 \times 10^{18}/cm^3$ and dislocation density of $2 \times 10^6/cm^2$ through the slicing, grinding and polishing processes, the substantially same result was obtained also in the modification of Example 3. In other words, it was confirmed that, when a GaN free-standing substrate having a thickness in a range of 100-600 µm and a diameter in a range of 40-152.4 mm is manufactured from n-type GaN single crystal having a thickness in a range of 100 µm to 10 cm, a diameter in a range of 40-160 mm, a carrier concentration of $1 \times 10^{15}$-$4 \times 10^{19}/cm^3$ and dislocation density of $1 \times 10^4$-$5 \times 10^6/cm^2$ through the slicing, grinding and polishing processes, the substantially same result is obtained.

The above showed that it is possible to improve the process yield to 50% or more, which is more than the prior art, in the GaN free-standing substrate made in Example 3 having a diameter of 40 mm or more, a thickness of 100 µm or more, dislocation density of $5 \times 10^6/cm^2$ or less, an impurity concentration of $4 \times 10^{19}/cm^3$ or less and hardness of 19.0 GPa or more. Furthermore, it was shown that, by making the hardness of the GaN substrate 20.0 GPa, 20.5 GPa and 21.0 GPa, it is possible to further improve the process yield respectively to 60% or more, 80% or more and 90% or more.

In addition, when examining the dispersion in the direction of the crystal axis vertical to a surface of the GaN free-standing substrate which was obtained in Example 3 in the same manner as Comparative Example, the dispersion in the direction of the crystal axis vertical to a surface was 0.1° or less per 10 mm in length along the surface at the dislocation density of $5 \times 10^6/cm^2$ or less, and 0.05° or less at the dislocation density of $1 \times 10^6/cm^2$ or less, hence, the dispersion was significantly improved compared with Comparative Example, which is a value sufficient for the application to the LE or the LED, etc. Furthermore, cracks or bumps caused by the plastic deformation which are seen in Comparative Example were not observed on the surface of the obtained GaN free-standing substrate, and an rms value in a 10 µm square region was 3 nm or less. This value is also sufficient for the application to the LE or the LED, etc.

Example 4

A GaN free-standing substrate in Example 4 was made in the same manner as in Examples 1-3, except in that the dislocation density of the GaN single crystal was changed to $1 \times 10^4/cm^2$, $1 \times 10^5/cm^2$ and $1 \times 10^6/cm^2$. Although the hardnesses of the GaN single crystal before the annealing were respectively about 18.15 GPa, 18.2 GPa and 18.25 GPa, the substantially same results as that of Examples 1-3 were obtained for other points.

Example 5

A GaN free-standing substrate in Example 5 was made in the same manner as in Examples 1-4, except in that the n-type dopant was changed to O, Ge, Se or Te. The substantially same results as that of Examples 1-4 were obtained also in this case.

Example 6

A GaN free-standing substrate in Example 6 was made in the same manner as in Examples 1-4, except in that a dopant during HVPE growth was changed to Mg, Zn, Be or C. When the obtained GaN single crystal was annealed in an oxygen atmosphere at 600° C. for 30 minutes, the GaN single crystal became p-type with carrier concentration of $1\times10^{16}$-$4\times10^{18}$/cm$^3$, or semi-insulating with resistivity of $1\times10^5$ Ωcm or more. The yellow luminescence intensity in PL in this case was very weak and the definitive PL data was not obtained, however, the same results as that of Examples 1-4 were obtained for the hardness of the GaN single crystal and the process yield. From this point, it is considered that, also in a p-type or semi-insulating GaN free-standing substrate, the hardness is improved by the same mechanism as that of the n-type GaN free-standing substrate and the process yield is improved.

Example 7

A GaN free-standing substrate in Example 7 was made in the same manner as in Examples 1-6, except of using a void substrate manufactured using a sapphire substrate of which surface is an R plane or an M plane. Although the GaN free-standing substrate obtained in this case was a substrate inclined from an M plane in an A or C axis direction or a direction therebetween in a range of 0°-5°, the substantially same results as that of Examples 1-6 were obtained for other points.

Modification 1 of Examples

A GaN free-standing substrate in Modification 1 was made in the same manner as in Examples 1-7, except in that the GaN single crystals were grown respectively using a MBE method, the MOVPE method and the sublimation method instead of using the HVPE method. The substantially same results as that of Examples 1-7 were obtained in each case.

Modification 2 of Examples

A method adopted in Examples 1, 2 and 4-7, in which a protective film is deposited on the GaN single crystal after the growth and annealed, was implemented to the GaN single crystal grown by the ammonothermal synthesis and the high-pressure synthesis method. The substantially same results as that of Examples 1, 2 and 4-7 were obtained in each case.

Modification 3 of Examples

A GaN free-standing substrate in Modification 3 was made in the same manner as in Examples 1, 2 and 4-7, except in that the protective film deposition method was changed to the plasma CVD method, a photo CVD method and a coating method. The substantially same results as that of Examples 1, 2 and 4-7 were obtained in each case.

Modification 4 of Examples

A GaN free-standing substrate in Modification 4 was made in the same manner as in Examples 1-7, except in that GaN crystal was replaced with AlN crystal. In this case, a result that AlN shows the substantially same behavior as GaN was obtained, thus, the substantially same results as that of Examples 1-7 were obtained.

Although the embodiment and Examples of the invention have been described, the invention according to claims is not to be limited to the above-mentioned embodiment and Examples. Further, please note that not all combinations of the features described in the embodiment and Examples are not necessary to solve the problem of the invention.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A nitride semiconductor free-standing substrate, comprising:
    a diameter of not less than 40 mm;
    a thickness of not less than 100 μm;
    a dislocation density of not more than $5\times10^6$/cm$^2$;
    an impurity concentration of not more than $4\times10^{19}$/cm$^3$; and
    a nanoindentation hardness of not less than 19.0 GPa at a maximum load in a range of not less than 1 mN and not more than 50 mN.

2. The nitride semiconductor free-standing substrate according to claim 1, further comprising:
    a surface inclined from a C plane in a range of not less than 0° and not more than 5°.

3. The nitride semiconductor free-standing substrate according to claim 1, further comprising:
    a surface inclined from an M plane in a range of not less than 0° and not more than 5°.

4. The nitride semiconductor free-standing substrate according to claim 1, wherein
    a direction of a crystal axis facing a direction closest to a normal line with respect to a surface of the substrate at each point in plane of the substrate comprises a dispersion of not more than 0.1° per 10 mm length along the surface of the substrate.

5. The nitride semiconductor free-standing substrate according to claim 1, further comprising:
    a surface that an rms value in a 10 μm square region is not more than 3 nm.

6. A nitride semiconductor device, comprising:
    the nitride semiconductor free-standing substrate according to claim 1.

* * * * *

UNITED STATES PATENT AND TRADEMARK OFFICE
CERTIFICATE OF CORRECTION

PATENT NO. : 9,779,934 B2  
APPLICATION NO. : 12/591423  
DATED : October 3, 2017  
INVENTOR(S) : Hajime Fujikura Page 1 of 1

It is certified that error appears in the above-identified patent and that said Letters Patent is hereby corrected as shown below:

On the Title Page

(30) Foreign Application Priority Data should read:  
Aug. 11, 2009 (JP) ................... 2009-186612

Signed and Sealed this  
Nineteenth Day of December, 2017

Joseph Matal  
*Performing the Functions and Duties of the*  
*Under Secretary of Commerce for Intellectual Property and*  
*Director of the United States Patent and Trademark Office*